US 10,439,065 B2

(12) United States Patent
Tellkamp et al.

(10) Patent No.: US 10,439,065 B2
(45) Date of Patent: Oct. 8, 2019

(54) INVERTED LEADS FOR PACKAGED ISOLATION DEVICES

(71) Applicant: Texas Instruments Incorporated, Dallas, TX (US)

(72) Inventors: John Paul Tellkamp, Rockwall, TX (US); Andrew Couch, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/975,022

(22) Filed: May 9, 2018

(65) Prior Publication Data

US 2019/0109233 A1    Apr. 11, 2019

Related U.S. Application Data

(60) Provisional application No. 62/571,082, filed on Oct. 11, 2017.

(51) Int. Cl.
    *H01L 29/78*    (2006.01)
    *H01L 23/495*    (2006.01)
    (Continued)

(52) U.S. Cl.
    CPC ........ *H01L 29/7846* (2013.01); *H01L 23/495* (2013.01); *H01L 23/4951* (2013.01);
    (Continued)

(58) Field of Classification Search
    CPC ... H01L 21/565; H01L 23/28; H01L 2224/48; H01L 2224/247; H01L 23/49506; H01L 23/49513; H01L 23/4952; H01L 23/642; H01L 23/49562; H01L 2924/14; H01L 23/495; H01L 23/49503; H01L 23/49575; H01L 23/4951; H01L 23/49555; H01L 23/645; H01L 23/647; H01L 24/48; H01L 24/73; H01L 24/49; H01L 29/7846;
    (Continued)

(56) References Cited

U.S. PATENT DOCUMENTS 6,548,328 B1 *   4/2003   Sakamoto .......... H01L 21/4821
                                                    257/666
8,022,522 B1 *   9/2011   Liou .................. H01L 23/3107
                                                    257/676
(Continued)

*Primary Examiner* — Jasmine J Clark
(74) *Attorney, Agent, or Firm* — Ronald O. Neerings; Charles A. Brill; Frank D. Cimino

(57) ABSTRACT

A packaged multichip isolation device includes leadframe including a first and second die pad, with a first and second lead extending outside a molded body having a downward extending lead bend near their outer ends. A first integrated circuit (IC) die on the first die pad has a first bond pad connected to the first lead that realizes a transmitter or receiver. A second IC die on the second die pad has a second bond pad connected to the second lead that realizes another of the transmitter and receiver. An isolation component is in a signal path of the isolation device including a capacitive isolator, or inductors for transformer isolation on or between the die. A midpoint of the thickness of the die pad is raised above a top level of the leads and in an opposite vertical direction relative to the downward extending bend of the external leads.

40 Claims, 5 Drawing Sheets

(51) Int. Cl.
  *H01L 23/64* (2006.01)
  *H01F 19/08* (2006.01)
  *H01L 23/00* (2006.01)

(52) U.S. Cl.
  CPC .. *H01L 23/49503* (2013.01); *H01L 23/49575* (2013.01); *H01L 23/645* (2013.01); *H01L 23/647* (2013.01); *H01F 2019/085* (2013.01); *H01L 23/49555* (2013.01); *H01L 24/16* (2013.01); *H01L 24/32* (2013.01); *H01L 24/48* (2013.01); *H01L 24/49* (2013.01); *H01L 24/73* (2013.01); *H01L 2224/04042* (2013.01); *H01L 2224/05571* (2013.01); *H01L 2224/32245* (2013.01); *H01L 2224/48091* (2013.01); *H01L 2224/48137* (2013.01); *H01L 2224/48247* (2013.01); *H01L 2224/48465* (2013.01); *H01L 2224/48471* (2013.01); *H01L 2224/48479* (2013.01); *H01L 2224/49171* (2013.01); *H01L 2224/73265* (2013.01); *H01L 2924/00014* (2013.01); *H01L 2924/14* (2013.01); *H01L 2924/181* (2013.01); *H01L 2924/19042* (2013.01); *H01L 2924/19105* (2013.01)

(58) Field of Classification Search
  CPC . H01L 2224/05571; H01L 2224/48465; H01L 2224/48471; H01L 2224/49171; H01L 2224/48479; H01L 2224/04042; H01L 2224/48091; H01L 2224/48137; H01L 2224/48247; H01L 2224/73265; H01L 2924/181; H01F 2019/085
  See application file for complete search history.

(56) References Cited

U.S. PATENT DOCUMENTS

| | | |
|---|---|---|
| 2006/0263943 A1 | 11/2006 | James |
| 2008/0173992 A1* | 7/2008 | Mahler ............... H01L 21/6836 257/676 |
| 2017/0179010 A1* | 6/2017 | Takada .................... H01L 24/06 |

* cited by examiner

INVERTED LEADS FOR PACKAGED ISOLATION DEVICES

CROSS REFERENCE TO RELATED APPLICATIONS

This application claims the benefit of Provisional Application Ser. No. 62/571,082 entitled "Inverted Lead Forming for Isolation Packages", filed Oct. 11, 2017.

FIELD

This Disclosure relates to packaged semiconductor isolation (ISO) devices, and more particularly to packaged multichip ISO devices with a leadframe having a first die on a first die pad and a second die on a second die pad.

BACKGROUND

In circuit designs for applications where high voltage (HV) is present, such as for motor control, it is generally necessary to take steps to reduce the potential risk to users of the electrical system. These steps traditionally include insulation, grounding, and the isolation of dangerous HV levels by establishing a dielectric separation from the HV. Techniques for passing signal information and power across a dielectric separation in a communication channel between integrated circuit (IC) die are known. A packaged ISO device prevents the propagation of direct current (DC) and unwanted AC currents between its input on one die and its output on the other die, while allowing the transmission of the desired AC signal.

The ISO device accomplishes this function using an isolation barrier between the first and second die that has a high breakdown voltage and low current leakage. A high resistance path exists across the isolation barrier, but the device can still transfer information encoded in the desired AC signal across the isolation barrier from one die to the other by capacitive coupling, inductive coupling (transformer isolation), or by optical coupling.

HV testing is for verification of the isolation performance of the channel (generally 2 or more channels) of a packaged ISO device, where a voltage level higher than the performance rating for the ISO device is generally applied across the ISO device. This voltage level is typically 1.2 or 1.3 times the rated ISO device voltage performance. For example, one may apply 6,500 V root mean square (RMS) between at least one external pin on a receiver die and at least one external pin on a transmitter die for a 5,000 V rms rated ISO device, and then looking for leakage current flowing between these external pins. This HV ISO test is typically performed by a contactor provided on each side of the package that shorts together all leads on each side, and in an air ambient.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes in addition to the dielectric separation for electrical isolation generally comprising a mold compound internal to the packaged multichip ISO device between the first die pad and the second die pad, there is also a dielectric path through the air external to the packaged multichip ISO that is a potential source of current leakage during HV ISO testing. This is because the electric field (E field) generated during HV testing of the ISO device extends into the air external to the mold compound of the ISO device package, including below the mold compound, which can limit the maximum voltage that can be applied during HV testing across the pins of the ISO device. This can also improve the ISO capability of disclosed ISO devices, making them more robust as to safety performance while operating in the field.

A conventional downset die pad that is typically used to improve the mold flow or increase the height for wire bonding is recognized to result in less mold compound thickness below the die pad as compared to the mold compound thickness above the die pad. This downset arrangement results in the internal E field (the E field lines between the respective die pads) adding more E field to the E field in the air gap between the leads (or land pads that the leads are on) under the mold compound that are biased during testing. Typically all leads on one side of the ISO device are biased relative to all the leads on the other side of the ISO device. Field lines extending out of the package from the internal E field adds E field to the external E field thus strengthening the total net E field intensity in the air gap between the leads under the mold compound. If the total E field is high enough to cause air ionization, the result is ISO test failures that can result in scrapping of packaged ISO devices.

Disclosed packaged ISO devices reduce the E-field when biased during testing (or while in field use) by maximizing the mold compound thickness between the location of the minimum internal dielectric spacing (being the gap between the respective die pads) and the region under the mold compound between the external leads which are generally soldered to printed circuit board (PCB) land pads. This mold thickness increase is realized by raising the vertical position of the die pads in the package relative to the downward extending lead bends near the outer ends of the leads, as opposed to conventionally both being positioned in the same vertical direction.

Disclosed aspects include a packaged multichip isolation device that includes a leadframe including a first and second die pad, with a first and second leads extending outside a molded body having a downward extending lead bend near their outer ends. A first IC die on the first die pad has a first bond pad connected to the first lead that includes functional circuitry configured for realizing a transmitter or a receiver. A second IC die on the second die pad has a second bond pad connected to the second lead including functional circuitry configured for realizing another of the transmitter and the receiver. An isolation component is in a signal path of the isolation device including a capacitive isolator for capacitive isolation, or inductors for transformer isolation on or between the IC die. A midpoint of the die pad thickness is raised above a top level of the leads and in an opposite vertical direction relative to the downward extending bend of the external leads.

BRIEF DESCRIPTION OF THE DRAWINGS

Reference will now be made to the accompanying drawings, which are not necessarily drawn to scale, wherein.

DETAILED DESCRIPTION

Figure 1A:
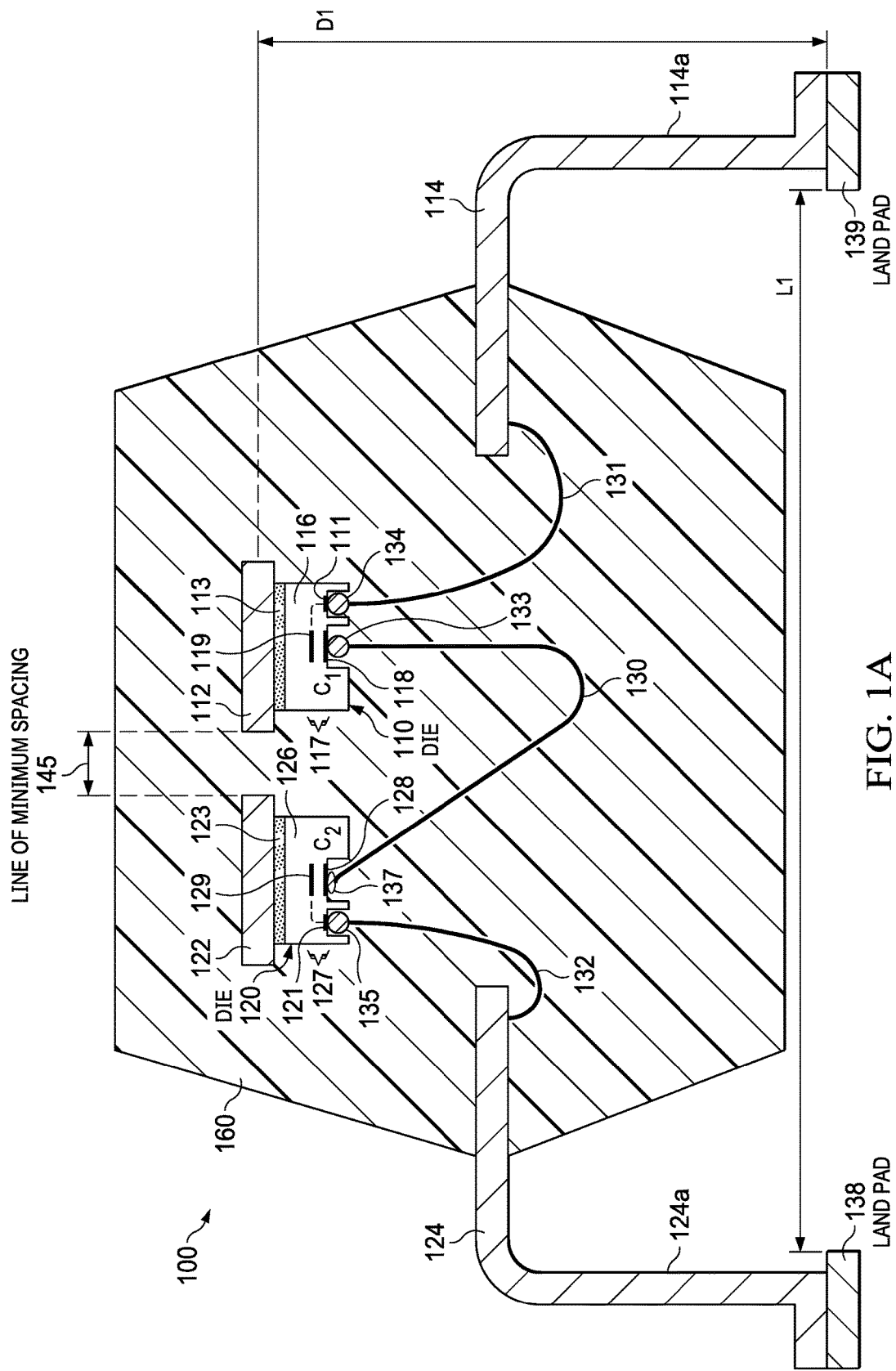
FIG. 1A is cross sectional view of an example packaged multichip ISO device having disclosed vertically raised die pads with the leads bent in the opposite direction relative to the die pads to provide inverted leads, shown with reinforced isolation, with ISO caps on the respective IC die wire bonded together.

Example aspects in this disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1B:
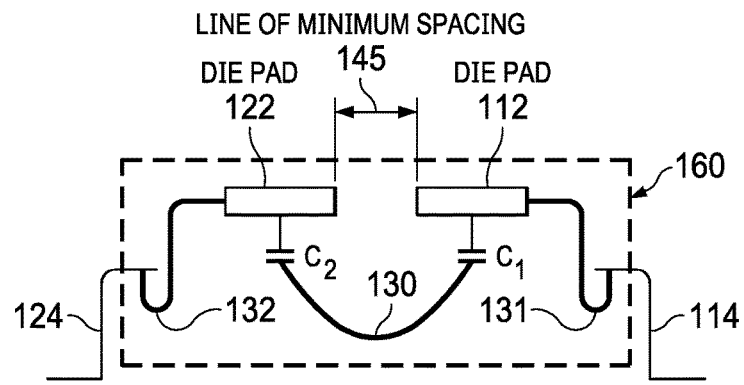
FIG. 1B shows an equivalent circuit for the ISO device shown in FIG. 1A.

FIG. 1A is a cross sectional view of an example packaged multichip ISO device 100 having disclosed raised die pads 112, 122 with first lead 114, and second lead 124 bent in the opposite vertical direction relative to the die pads 112, 122 to provide inverted leads. It can be seen that the full thickness of the first die pad 112 and the second die pad 122 are both raised above a top level of the leads 114, 124, and in an opposite vertical direction relative to the downward extending bends 114a, 124a of the leads 114, 124. The 114, 124 leads are shown attached to land pads 138, 139 that are typically part of a PCB. FIG. 1A shows the line of minimum spacing 145 between the die pads 112, 122. FIG. 1B shows an equivalent circuit for the ISO device 100 shown in FIG. 1A with the package outline defined by the mold compound 160 shown by a dashed line. The leadframe material typically comprises copper and has a thickness between 152 µm and 254 µms.

The midpoint of the thickness of the first die pad 112 and the second die pad 122 are generally positioned above a top level of the leads 114, 124 by 100 µm to 550 µm. This raised disclosed die pad arrangement results in the minimum distance shown as $D_1$ which extends to the tops of the land pads 138, 139 in FIG. 1A being increased and the E field between the die pads being shifted up, compared to a non-downset die pad arrangement or particularly when compared to a conventional downset arrangement. The distance between the land pads 138, 139 upon which the external E field during HV testing is imposed is the minimum external distance shown in FIG. 1A as $L_1$.

From basic physics, an E field is induced in the dielectric spacing between 2 electrical conductors at different potentials. If the spacing between these conductors is increased, the E intensity is decreased. In this way, the E field between the die pads 112, 122 being conductors, typically comprising copper, radiates out into the dielectric from the line of minimum spacing 145 shown between the die pads 112, 122. If the distance from the line of minimum spacing 145 to the external surface under the mold compound 160 of the ISO device package is increased, the strength of the internal E extending under the ISO device package is reduced, which reduces the sum of the external E field extending from the internal E field between the die pads 112, 122 and the external E field (between land pad 138 and land pad 139).

FIG. 1B shows an equivalent circuit for the ISO device 100 shown in FIG. 1A. During HV ISO testing of an ISO device such as ISO device 100, all the leads on either side of the ISO device 100 are generally shorted together by a contactor, such as 8 pins on each side in one particular package arrangement. This brings the potential (V) of the die pad 112 to its first lead 114 to one V level through coupling through the circuitry in the IC substrate then the bond wire 131 shown, and die pad 122 to its lead 124 to the other V level through coupling through the circuitry in its IC substrate then the bond wire 132 shown. As a result, as described above, during HV ISO testing there is an internal E field from the die pad 112 to the die pad 122 through the mold compound 160 that extends externally between the first lead 114 and second lead 124 through the air under the mold compound 160, and an external E field between the leads 114 and 124 including through the air under the mold compound 160.

Moreover, as also described above, ISO devices are generally tested at HV levels above their isolation rating. This HV testing creates an E field external to the mold compound 160 of the package. When this total external E field intensity exceeds the ionization threshold of the atmosphere surrounding the ISO device (typically air), the current flow causing the ionization can be interpreted by the automated tester as an "Arc" failure (for the ISO device). The threshold for avalanche breakdown of the air across the package can also be exceeded and an "Arc" failure detected. To minimize both of these mechanisms, it is recognized to be advantageous to reduce the external E field intensity (to below about 2 to 3 volts per micron, the ionization potential of air at 25° C.), or minimize the volume of air above this threshold. By raising the die pads 112, 122 in the opposite direction relative to the external downward extending bends 114a, 124a, the E-field generated between the die pads 112, 122 is further away ($D_1$ in FIG. 1A) from the external portion of the first and second leads 114, 124 and the gap between the leads under the mold compound 160 (see $L_1$ in FIG. 1A that is the gap between the land pads 138, 139 that sets the gap between the leads under the mold compound 160). This reduced E-field generated results in a reduced number of ions generated in the surrounding air during HV testing.

The isolation utilized for the packaged multichip ISO device 100 is reinforced isolation where the first IC die 110 and second IC die 120 each have an ISO cap shown as $C_1$ and $C_2$, respectively, that are wire bonded together by a bond wire 130. Although shown in FIG. 1A having capacitive isolation, the isolation for disclose ISO devices generally comprises an isolation component in a signal path of the isolation device including a capacitive isolator on at least one of the first IC die and second IC die for capacitive isolation, or an inductor for transformer isolation positioned on or between the first IC die and the second IC die.

The first IC die 110 is on a die attach adhesive 113 on a first die pad 112 that includes functional circuitry 116 with a metal stack 117 thereon including a top metal layer and a plurality of lower metal layers. The first IC die 110 includes at least a first isolation capacitor (first ISO cap) shown as $C_1$ that utilizes the top metal layer as a first top plate 118 and has a first bottom plate 119.

Due to the series connection provided by the ISO caps (see FIG. 1B), during operation of the packaged multichip ISO device 100 shown in FIG. 1A based on the voltage divider rule the bondwire 130 is generally at one half the HV difference between the bottom plate 119 of the first IC die 110 and the bottom plate 129 of the second IC die 120. However, in some somewhat uncommon applications, the voltage on the top plate may not be equal to one half the HV difference, but instead be some other fraction that results from the respective ISO cap capacitances not being equal to one another in the series assembly. The full HV appears between the first die pad 112 and the second die pad 122 (the same HV as being applied between the bond pad 111 and the bond pad 121).

The first top plate 118 has a top dielectric layer thereon (such as comprising a dielectric layer on another dielectric layer) that has a top plate dielectric aperture, with one of the lower metal layers as its bottom plate. Similarly, the second IC die 120 is on the die attach adhesive 123 on the second die pad 122 including functional circuitry 126 with a metal stack thereon 127 including a top metal layer and a plurality of lower metal layers, with at least a second ISO cap shown as $C_2$ utilizing the top metal layer as the second top plate 128 along with the second bottom plate 129. The second top plate 128 has a top dielectric layer thereon having a top plate dielectric aperture and one of the lower metal interconnect layers as its bottom plate.

Bond pads comprising the top metal layer are indirectly coupled to the bottom plates 119 and 129 of the ISO caps through vias and intermediate metal levels as well as circuitry (depicted by dashed lines shown in FIG. 1A). The bond pad 111 is coupled by connection circuitry depicted by a dashed line to the first bottom plate 119, and the bond pad 121 coupled by connection circuitry depicted by a dashed line to the second bottom plate 129. The circuitry for coupling bond pads to the bottom plates 119 and 129 generally comprises analog-to-digital converters or digital-to-analog converters which includes groups of transistors, before going through vias and the respective metal levels of their metal stacks to reach their respective bond pads 111 and 121.

During packaged multichip ISO device 100 operation, there is generally an analog signal that comes into the packaged multichip ISO device 100 externally from the first lead 114 and the second lead 124 that get connected by bondwires 131, 132 to the bond pads 111 and 121, respectively. Although shown with bond wire connections, these connections can be fused to the die pad connection made by the leadframe material or other arrangements such as a "flip-chip" bump connection which functionally replaces the bond wire connections to the leads.

In typical operation, there will generally be signals either coming from the first lead 114 pin that gets transmitted across to the other side of the ISO barrier, such as to the pin of the second lead 124, or coming from second lead 124 and being sent across the ISO barrier back to first lead 114. Generally, there can be more than one communication "channel" on the IC die and the die can have either one channel as a transmit channel and 3 channels as receive channels (on a 4-channel device), or any combination of transmit/receive channels on a device that has 1 to 6 channels. Then the signal from the bond pads 111 and 121 get routed to signal processing circuitry to send/receive digital signals to the bottom plates 119 and 129 that will transmit across the ISO barrier provided by $C_1$ and $C_2$.

The first and second leads 114, 124 together with the first die pad 112 and second die pad 122 may collectively be termed a split die pad leadframe. The leadframe as known in the art is generally manufactured by either etching or stamping copper or a copper alloy material into the desired form to provide external pads, routing, and die supports within the package.

Functional circuitry 116 and 126 realizes and carries out a desired functionality, such as that of a digital IC or an analog IC, and in one aspect comprises a BiCMOS (MOS and Bipolar) IC. The capability of the functional circuitry provided on an IC mentioned herein may vary, for example ranging from a simple device to a complex device. The specific functionality mentioned herein contained within functional circuitry is not of importance.

The bond wire 130 is embedded in a mold compound 160, typically a heterogeneous material comprising epoxy with embedded silica filler particles. A second end of the bond wire 130 includes a stitch bond 137 as shown that has a wire approach angle which is not normal to the surface of the second top plate 128. There is a ball 133 shown on the first top plate 118, a ball 134 shown on bond pad 111, and a ball 135 shown on bond pad 121.

The first ISO and second ISO caps $C_1$ and $C_2$ generally can have silicon oxide as their capacitor dielectric layer. The ISO caps and generally have a capacitor dielectric layer thickness of at least 4 μm to provide a nominal breakdown voltage of at least 2,000 Volts. The capacitor dielectric layer thickness is more generally 2 μm to 20 μm.

To enable molded packaged devices to be mounted onto land pads that are on a PCB surface, the leads exiting the molded body (typically in about the vertical center of the package) are formed in a "gull wing" shape to allow soldering on the surface plane of the PCB. An E field is induced in the air around the leads once they are outside the molded body. The "gull wing" shape is vertically asymmetrical. It is recognized to be advantageous for the vertical asymmetry of the internal E field to be on the opposite side from the asymmetrical external E field produced by the leads. This will reduce the resulting combined E field in the air surrounding the package and thereby reduce the occurrence of "arc" failures, or other undesirable affects from ionization of the air during packaged ISO device testing.

Figure 2:
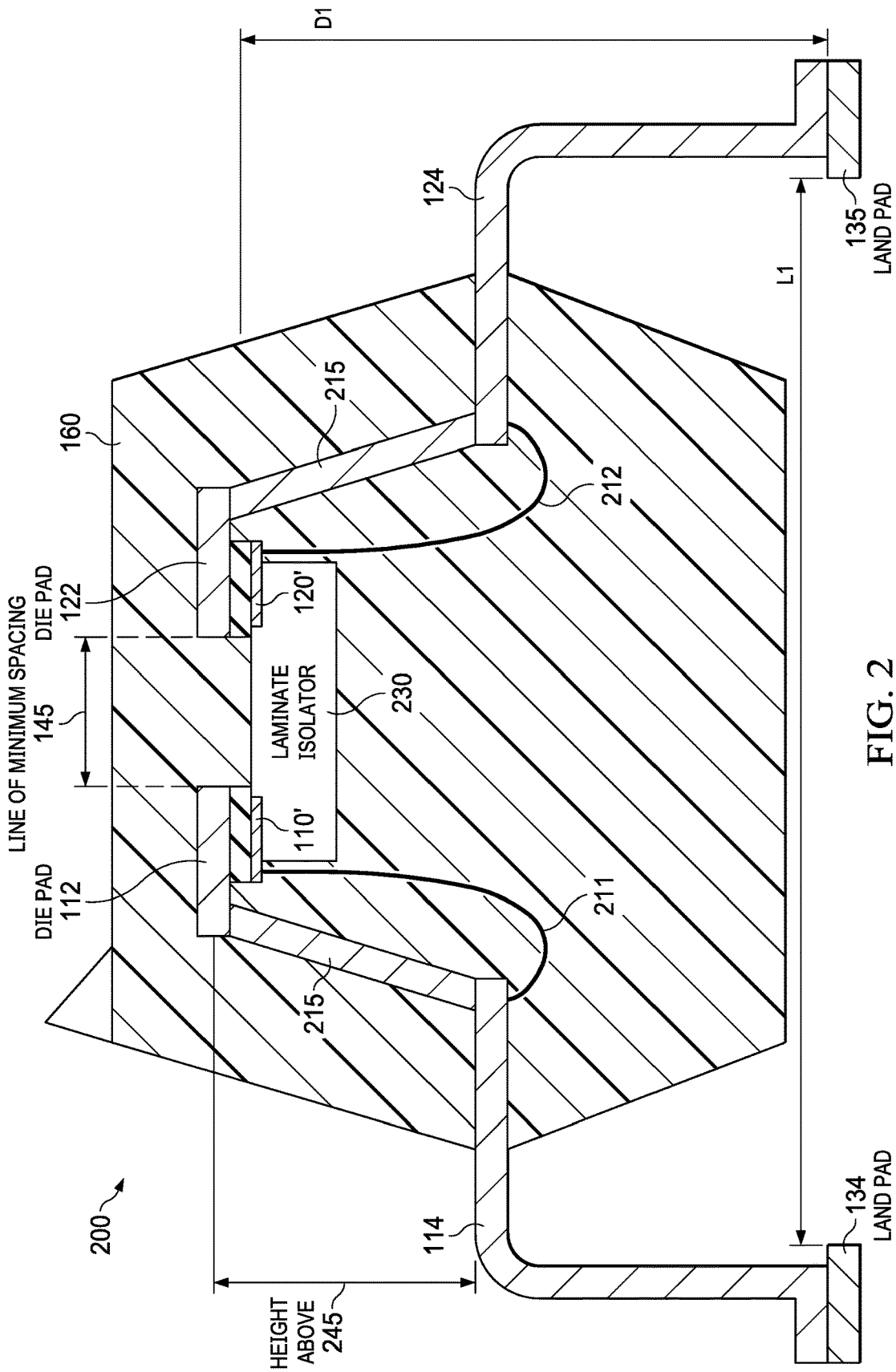
FIG. 2 is cross sectional view of an example packaged multichip ISO device having disclosed raised die pads with leads bent in the opposite direction to the die pads to provide inverted leads, showing a passive ISO device between the die pads. The height above is the distance measured from the top of the leads to the midpoint of the thickness of the die pads.

FIG. 2 is cross sectional view of an example packaged multichip ISO device 200 having disclosed raised first and second die pads 112, 122 with leads bent in the opposite direction to the die pads to provide inverted leads, showing a laminate isolator 230 between the die pads 112 and 122. The height above 245 as described above is the distance measured from the midpoint of the die pads 112, 122 that the die pads are raised relative to the top of the leads shown as first lead 114 on one side, and second lead 124 on an opposite side. There are supports 215 shown in FIG. 2 that are electrically connected to the respective leads 114, 124.

There is a transmitter die 110' and a receiver die 120' on the respective die pads 112, 122. These die pads are connected to the supports 215. There are bond wires shown as 211, and 212. The dies 110', 120' do not have isolation properties as the isolation a laminate isolator 230 coupled between the die 110 and 120 provides the isolation functionality for the ISO device 200. The laminate isolator 230 can comprise a laminate air or magnetic enhanced transformer. For magnetic enhanced transformers disclosed raised die pads are actually generally more effective because the higher relative thickness of the magnetic enhanced transformer needs a deeper downset for proper molding.

Figure 3:
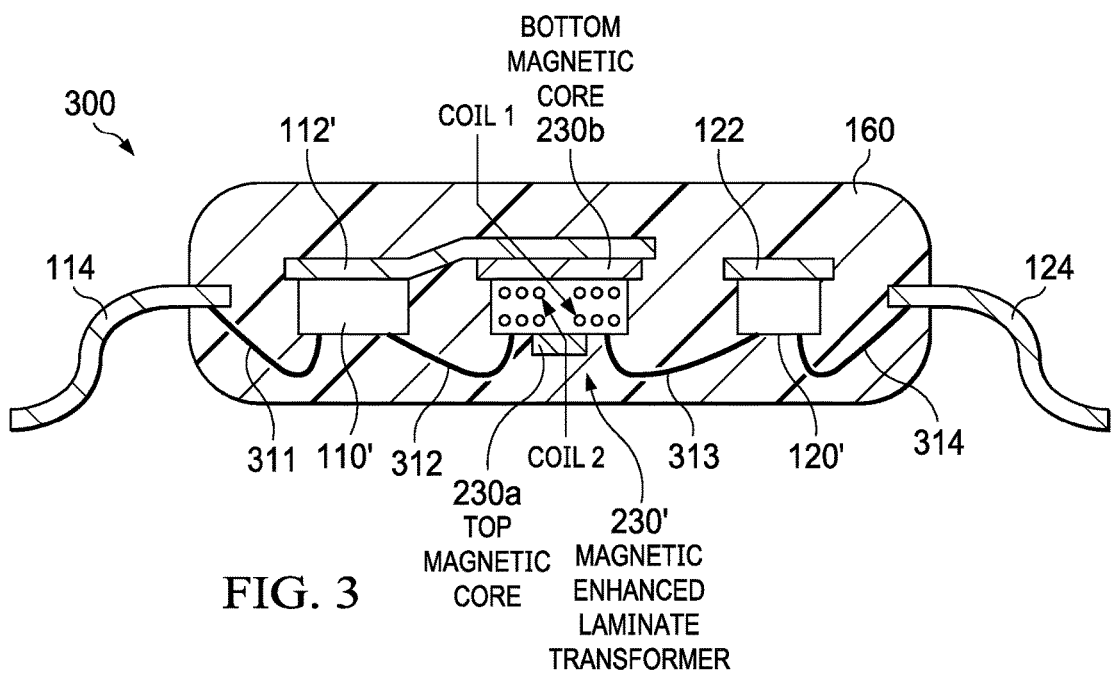
FIG. 3 is cross sectional view of an example packaged multichip ISO device having disclosed raised die pads with leads bent in the opposite direction relative to the die pads to provide inverted leads, showing a laminated transformer and an IC die on a die pad that has different heights which are both above the top of the leads.

FIG. 3 is cross sectional view of an example packaged multichip ISO device 300 having disclosed raised die pads shown as 112' and 122 with leads 114, 124 bent in the opposite direction relative to the die pads to provide inverted leads. Die pad 112' has 2 different heights, with a magnetic enhanced laminate transformer 230' on the higher portion of die pad 112' and a transmitter die 110' on the lower portion of the die pad 112' that are both at heights so their full thickness is above the top of the leads 114, 124.

The magnetic enhanced laminate transformer 230' comprises a magnetic enhanced laminate transformer with coil 1 (with N1 turns) and coil 2 (with N2 turns) with magnetic field enhancing magnetic cores comprising top magnetic core 230a and bottom magnetic core 230b that are typically ferrite'. Die pad 112' has a transmitter die 110' thereon. There are bond wires shown as 311, 312, 313 and 314. Bond wire 311 is connected to coil 2 (thus in operation is at the same potential as die pad 112), and bond wire 313 is connected to coil 1 (thus in operation is at the same potential as die pad 122). This FIG. shows there can be multiple die pad vertical locations in a disclosed ISO package as long as all the die pad vertical locations are above the top of the external leads.

Regarding an assembly method for disclosed packaged multichip ISO devices, a leadframe is provided including a first die pad and a second die pad spaced apart from one another comprising a plurality of leads including a first lead and a second lead. A first IC die is mounted on the first die pad which has a first bond pad connected to the first lead including functional circuitry configured for realizing a transmitter or a receiver, and a second IC die is mounted on the second die pad which has a second bond pad connected to the second lead including functional circuitry configured for realizing another of the transmitter and the receiver.

There is an isolation component in a signal path of the isolation device including a capacitive isolator on at least one of the first and second IC die for capacitive isolation, or a first and second inductor for transformer isolation positioned on or between the first and the second IC die. Molding with a molding material forms a molded body encapsulating the first and second IC die and the first and second die pads, where the leads extend outside the molded body each having a downward extending lead bend near their outer ends. The leads are bent so that a midpoint of a thickness of the first die pad and the second die pad are both positioned above a top level of the plurality of leads, and in an opposite vertical direction relative to the downward extending bend of the external leads.

The lead bending to form packaged multichip ISO devices can be changed with minimal impact to the device components (leadframes, dies, and wire bonds). This can be accomplished by a custom leadframe strip design with die pads "upset" instead of being downset, and a mirror image die layout. This processing involves the leadframe strip to be processed "upside down" for die mount and wire bonding, and then flipped to a standard orientation for molding and lead forming (bending). This allows the leadframe strip to be processed using the same mold and lead bend tooling as is used for conventional "non-inverted" devices.

Another example assembly manufacturing method option includes use of a standard leadframe strip design with downset die pads, processing conventionally at die mount, wire bond, and molding, then flipping to "upside down" for lead forming (bending). This method results in the molded body being inverted, and thus changing the pin-out. Another example assembly manufacturing method option includes the use the standard strip design with "downset" die pads, processing conventionally at die mount and wire bonding, then flipping to "upside down" for molding and lead forming (bending). This method results in the molded body being in the "normal" orientation, but changes the pin-out. Disclosed ISO packages with inverted leads are thus a cost effective change to improve HV test yield, and enables higher voltage testing (thus increased ISO device performance).

EXAMPLES

Disclosed embodiments of the invention are further illustrated by the following specific Examples, which should not be construed as limiting the scope or content of this Disclosure in any way.

Figure 4A:
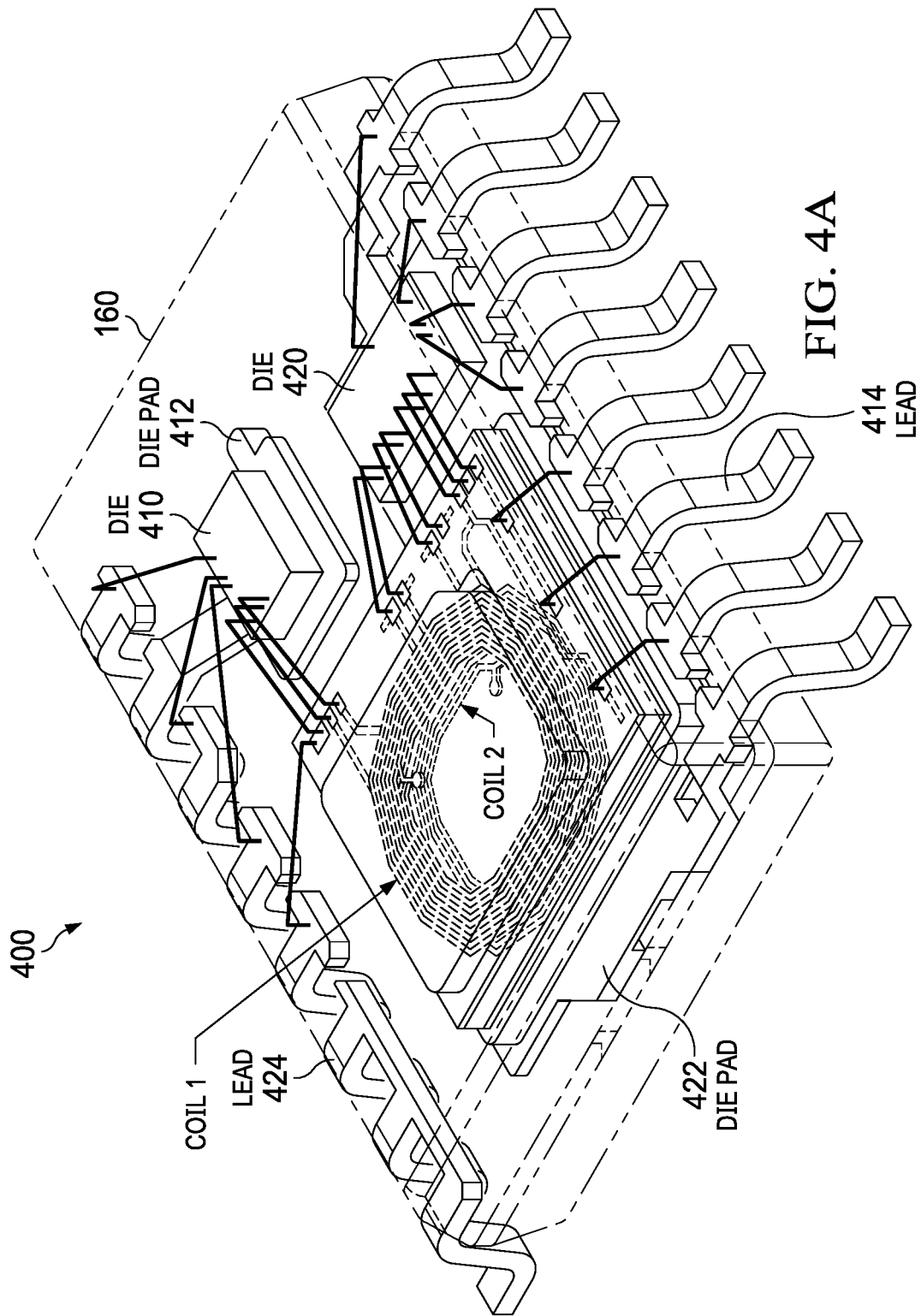
FIG. 4A shows a conventional packaged ISO device that was ISO test simulated to have its E field intensity as a function of position determined.

FIG. 4A shows a conventional packaged ISO device 400 that was ISO test simulated to have its E field intensity as a function of position determined. The packaged multichip ISO device 400 had a die pad 422 downset in the same vertical direction as the external lead form of leads 414, 424, having 16 pins, 8 on each side, which was ISO tested at 9 kV peak. The packaged multichip ISO device 400 also included a die pad 412 with an IC die 410 thereon showing bond wires, and on the die pad 422 there was also a magnetic enhanced laminate transformer (coil 1 and coil 2 shown) that was the same as magnetic enhanced laminate transformer 230' in FIG. 3 and an IC die 420 thereon. There are leads on opposite sides of the packaged ISO device 400 with lead 424 identified on a first side and lead 414 identified on the second side opposite to lead 424. The bond wires are to the IC die 410 that is on die pad 412. The air volume external to the packaged ISO device between the external portion on the lead 424 and the outer edge of the mold compound 160 extending to under the bottom of the mold compound 160 was found to have an E field high enough to cause the air there to ionize, being at least between 2 and 3 Volts/μm.

Figure 4B:
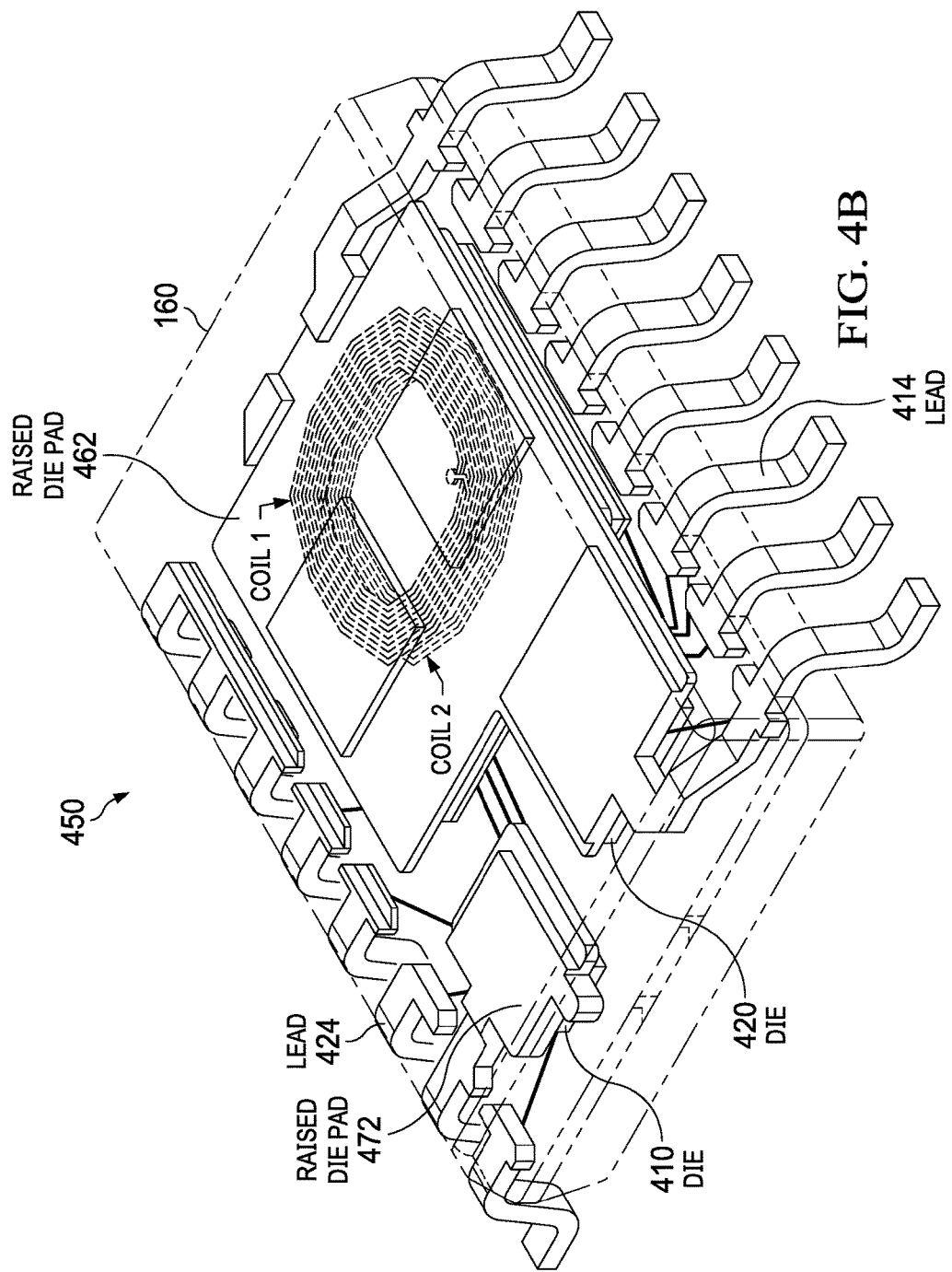
FIG. 4B shows a disclosed packaged device based on the packaged multichip ISO device in FIG. 3 that was ISO test simulated to have its E field intensity as a function of position determined.

FIG. 4B shows a disclosed packaged multichip ISO device 450 based on the packaged multichip ISO device 300 in FIG. 3 that had raised die pads now shown as die pad 472 and die pad 462. Coil 1 and coil 2 of the magnetic enhanced laminate transformer 230' in FIG. 3 are shown in FIG. 4B. The minimum distance ($D_1$ in FIG. 1A) is thus increased with an extra mold compound 160 thickness in this path, spatially separating the vertical distance between the gap between the die pads 462, 472 and the region generally filled with air between the land pads and leads under the mold compound 160 so that the internal E field is moved up, and there is thus less E intensity reaching in the air between the external leads under the mold compound 160. The bond wires are to the IC die 410 that is on the raised die pad 462. The area under the mold compound 160 was not a high E field region, which can be compared to results from the conventional packaged ISO device described above where the area under the mold compound 160 and between the edge of the mold compound 160 and the exterior of the lead was a high E field region with an E field high enough in intensity to cause the air there to ionize, being at least between 2 and 3 Volts/µm.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this Disclosure.

The invention claimed is:

1. A packaged multichip isolation device, comprising:
a leadframe including a first die pad and a second die pad separated from each other with a plurality of leads including a first and second lead extending outside a molded body each having a downward extending lead bend near their outer ends;
a first integrated circuit (IC) die on the first die pad which has a first bond pad connected to the first lead including functional circuitry configured for realizing a transmitter or a receiver;
a second IC die on the second die pad which has a second bond pad connected to the second lead including functional circuitry configured for realizing another of the transmitter and the receiver;
an isolation component in a signal path of the isolation device including a capacitive isolator on at least one of the first and second IC die for capacitive isolation, or a first and second inductor for transformer isolation positioned on or between the first and the second IC die;
wherein a midpoint of a thickness of the first die pad and the second die pad is raised above a top level of the plurality of leads and in an opposite vertical direction relative to the downward extending bend of the external leads.

2. The packaged multichip isolation device of claim 1, wherein a bottom of the first die pad and of the second die pad are both positioned above the top level of the plurality of leads.

3. The packaged multichip isolation device of claim 2, wherein the midpoints of the first die pad and the second die pad are both are both positioned at least 0.1 mm above the top level of the plurality of leads.

4. The packaged multichip isolation device of claim 3, wherein the midpoints of the first die pad and the second die pad are both are both positioned at different levels.

5. The packaged multichip isolation device of claim 1, wherein the isolation component comprises the capacitive isolator.

6. The packaged multichip isolation device of claim 5, wherein at least one of the first IC die and the second IC die include a metal stack including a top metal layer and a plurality of lower metal layers thereon providing an isolation capacitor utilizing the top metal layer as a top plate and one of the plurality of lower metal layers as its bottom plate.

7. The packaged multichip isolation device of claim 1, wherein the isolation component comprises the transformer isolation.

8. The packaged multichip isolation device of claim 1, wherein the isolation component comprises a magnetic enhanced laminate transformer, or a laminate-based capacitor positioned between the first IC die and the second IC die.

9. The packaged multichip isolation device of claim 1, further comprising a first bond wire coupling the first bond pad to the first lead and a second bond wire coupling the second bond pad to the second lead.

10. A method of assembling a packaged multichip isolation device, comprising:

providing a leadframe including a first die pad and a second die pad spaced apart from one another comprising a plurality of leads including a first lead and a second lead;
mounting a first integrated circuit (IC) die on the first die pad which has a first bond pad connected to the first lead including functional circuitry configured for realizing a transmitter or a receiver and a second IC die on the second die pad which has a second bond pad connected to the second lead including functional circuitry configured for realizing another of the transmitter and the receiver;
wherein there is an isolation component in a signal path of the isolation device including a capacitive isolator on at least one of the first and second IC die for capacitive isolation, or a first and second inductor for transformer isolation positioned on or between the first and the second IC die;
molding with a molding material to form a molded body encapsulating the first and second IC die and the first and second die pads, where the leads extend outside the molded body each having a downward extending lead bend near their outer ends, and
bending the leads so that a midpoint of a thickness of the first die pad and the second die pad are both positioned above a top level of the plurality of leads, and in an opposite vertical direction relative to the downward extending bend of the external leads.

11. The method of claim 10, wherein a bottom of the first die pad and the second die pad are both positioned above the top level of the plurality of leads.

12. The method of claim 10, wherein the midpoints of the first die pad and the second die pad are both are both positioned at least 0.1 mm above the top level of the plurality of leads.

13. The method of claim 12, wherein the midpoints of the first die pad and the second die pad are both are both positioned at different levels.

14. The method of claim 10, wherein the isolation component comprises the capacitive isolator.

15. The method of claim 14, wherein at least one of the first IC die and the second IC die include a metal stack including a top metal layer and a plurality of lower metal layers thereon providing an isolation capacitor utilizing the top metal layer as a top plate and one of the plurality of lower metal layers as its bottom plate.

16. The method of claim 10, wherein the isolation component comprises transformer isolation.

17. The method of claim 10, wherein the isolation component comprises a magnetic enhanced laminate transformer or a laminate-based capacitor positioned between the first IC die and the second IC die.

18. The method of claim 10, further comprising positioning a first bond wire coupling the first bond pad to the first lead and a second bond wire coupling the second bond pad to the second lead.

19. The method of claim 10, wherein the leadframe is part of a leadframe strip which is processed upside down for the mounting and for wire bonding the IC die to the leadframe, and wherein the leadframe strip is flipped to a standard orientation for the molding and for the bending.

20. The method of claim 10, wherein the leadframe is part of a leadframe strip with a downset for the first and second die pad, which is processed upside down for the mounting, for wire bonding the IC die to the leadframe and wherein the leadframe strip is flipped upside down for the molding and the bending.

21. A packaged multichip isolation device, comprising:
a first die pad and a second die pad separated from each other with a plurality of leads including a first and second lead extending outside a molded body each having a downward extending lead bend near their outer ends;
a first integrated circuit (IC) die on the first die pad which has a first bond pad connected to the first lead including functional circuitry configured for realizing a transmitter or a receiver;
a second IC die on the second die pad which has a second bond pad connected to the second lead including functional circuitry configured for realizing another of the transmitter and the receiver;
an isolation component in a signal path of the isolation device including a capacitive isolator on at least one of the first and second IC die for capacitive isolation, or a first and second inductor for transformer isolation positioned on or between the first and the second IC die;
wherein a midpoint of a thickness of the first die pad and the second die pad is raised above a top level of the plurality of leads and in an opposite vertical direction relative to the downward extending bend of the external leads.

22. The packaged multichip isolation device of claim 21, wherein a bottom of the first die pad and of the second die pad are both positioned above the top level of the plurality of leads.

23. The packaged multichip isolation device of claim 22, wherein the midpoints of the first die pad and the second die pad are both are both positioned at least 0.1 mm above the top level of the plurality of leads.

24. The packaged multichip isolation device of claim 23, wherein the midpoints of the first die pad and the second die pad are both are both positioned at different levels.

25. The packaged multichip isolation device of claim 21, wherein the isolation component comprises the capacitive isolator.

26. The packaged multichip isolation device of claim 25, wherein at least one of the first IC die and the second IC die include a metal stack including a top metal layer and a plurality of lower metal layers thereon providing an isolation capacitor utilizing the top metal layer as a top plate and one of the plurality of lower metal layers as its bottom plate.

27. The packaged multichip isolation device of claim 21, wherein the isolation component comprises the transformer isolation.

28. The packaged multichip isolation device of claim 21, wherein the isolation component comprises a magnetic enhanced laminate transformer, or a laminate-based capacitor positioned between the first IC die and the second IC die.

29. The packaged multichip isolation device of claim 21, further comprising a first bond wire coupling the first bond pad to the first lead and a second bond wire coupling the second bond pad to the second lead.

30. A method of assembling a packaged multichip isolation device, comprising:
providing a first die pad and a second die pad spaced apart from one another comprising a plurality of leads including a first lead and a second lead;
mounting a first integrated circuit (IC) die on the first die pad which has a first bond pad connected to the first lead including functional circuitry configured for realizing a transmitter or a receiver and a second IC die on the second die pad which has a second bond pad connected to the second lead including functional circuitry configured for realizing another of the transmitter and the receiver;
wherein there is an isolation component in a signal path of the isolation device including a capacitive isolator on at least one of the first and second IC die for capacitive isolation, or a first and second inductor for transformer isolation positioned on or between the first and the second IC die;
molding with a molding material to form a molded body encapsulating the first and second IC die and the first and second die pads, where the leads extend outside the molded body each having a downward extending lead bend near their outer ends, and
bending the leads so that a midpoint of a thickness of the first die pad and the second die pad are both positioned above a top level of the plurality of leads, and in an opposite vertical direction relative to the downward extending bend of the external leads.

31. The method of claim 30, wherein a bottom of the first die pad and the second die pad are both positioned above the top level of the plurality of leads.

32. The method of claim 30, wherein the midpoints of the first die pad and the second die pad are both are both positioned at least 0.1 mm above the top level of the plurality of leads.

33. The method of claim 32, wherein the midpoints of the first die pad and the second die pad are both are both positioned at different levels.

34. The method of claim 30, wherein the isolation component comprises the capacitive isolator.

35. The method of claim 34, wherein at least one of the first IC die and the second IC die include a metal stack including a top metal layer and a plurality of lower metal layers thereon providing an isolation capacitor utilizing the top metal layer as a top plate and one of the plurality of lower metal layers as its bottom plate.

36. The method of claim 30, wherein the isolation component comprises the transformer isolation.

37. The method of claim 30, wherein the isolation component comprises a magnetic enhanced laminate transformer or a laminate-based capacitor positioned between the first IC die and the second IC die.

38. The method of claim 30, further comprising positioning a first bond wire coupling the first bond pad to the first lead and a second bond wire coupling the second bond pad to the second lead.

39. The method of claim 30, wherein the leadframe is part of a leadframe strip which is processed upside down for the mounting and for wire bonding the IC die to the leadframe, and wherein the leadframe strip is flipped to a standard orientation for the molding and for the bending.

40. The method of claim 30, wherein the leadframe is part of a leadframe strip with a downset for the first and second die pad, which is processed upside down for the mounting, for wire bonding the IC die to the leadframe and wherein the leadframe strip is flipped upside down for the molding and the bending.

* * * * *